(12) United States Patent
Chinchole et al.

(10) Patent No.: US 11,354,209 B2
(45) Date of Patent: Jun. 7, 2022

(54) COLUMN REDUNDANCY DATA ARCHITECTURE FOR YIELD IMPROVEMENT

(71) Applicant: SanDisk Technologies LLC, Addison, TX (US)

(72) Inventors: Vijay Sukhlah Chinchole, Bangalore (IN); Harihara Sravan Ancha, Bangalore (IN); Jay Patel, Bangalore (IN)

(73) Assignee: SanDisk Technologies LLC, Addison, TX (US)

( * ) Notice: Subject to any disclaimer, the term of this patent is extended or adjusted under 35 U.S.C. 154(b) by 87 days.

(21) Appl. No.: 16/847,232

(22) Filed: Apr. 13, 2020

(65) Prior Publication Data

US 2021/0318939 A1  Oct. 14, 2021

(51) Int. Cl.
  *G11C 29/00* (2006.01)
  *G06F 11/20* (2006.01)
  *G06F 3/06* (2006.01)

(52) U.S. Cl.
  CPC ........ *G06F 11/2094* (2013.01); *G06F 3/0619* (2013.01); *G06F 3/0653* (2013.01); *G06F 3/0679* (2013.01)

(58) Field of Classification Search
  CPC .... G06F 3/0619; G06F 3/0653; G06F 3/0679; G06F 11/2094
  See application file for complete search history.

(56) References Cited

U.S. PATENT DOCUMENTS

| | | | | |
|---|---|---|---|---|
| 5,337,318 | A * | 8/1994 | Tsukakoshi | G11C 29/56 714/708 |
| 7,134,057 | B1 * | 11/2006 | Kaushik | G11C 29/808 714/711 |
| 7,405,985 | B2 * | 7/2008 | Cernea | G11C 29/848 365/200 |
| 7,502,258 | B2 | 3/2009 | Kawai | |
| 8,681,548 | B2 | 3/2014 | Liu et al. | |
| 9,348,694 | B1 | 5/2016 | Nassie | |
| 9,583,220 | B2 | 2/2017 | Tsai et al. | |
| 9,748,001 | B2 * | 8/2017 | Li | G11C 29/00 |
| 9,792,175 | B2 | 10/2017 | Sharma et al. | |
| 2003/0053348 | A1 * | 3/2003 | Marotta | G11C 29/80 365/200 |
| 2007/0223291 | A1 * | 9/2007 | Cernea | G11C 29/848 365/200 |
| 2009/0086541 | A1 * | 4/2009 | Chen | G11C 29/789 365/185.09 |
| 2009/0158084 | A1 * | 6/2009 | Merandat | G11C 29/44 714/5.1 |

(Continued)

*Primary Examiner* — Kyle Vallecillo
*Assistant Examiner* — Enamul M Kabir
(74) *Attorney, Agent, or Firm* — Volpe and Koenig

(57) ABSTRACT

Methods and circuits for storing column redundancy data are provided herein. A circuit may comprise a column redundancy data array, which may store an address and a plurality of match bits. A first portion of bits of the address may reference a range of columns of a memory array and a second portion of bits of the address may reference a division of the memory array in which a column of the range of columns is located. Each of the match bits may indicate whether one of the columns of the range of columns is defective.

17 Claims, 18 Drawing Sheets

| New Address Format | Match <3:0> | | | |
|---|---|---|---|---|
| Starting Address of Divisions to Number of Divisions <4 Divisions> | Information For Four Consecutive Addresses | | | |
| Address<12:2> | DIV0 | DIV1 | DIV2 | DIV3 |
| | GOOD | BAD | BAD | GOOD |
| Starting Address of Divisions to Number of Divisions <4 Divisions> | Information For Four Consecutive Addresses | | | |
| Address<12:2> | DIV0 | DIV1 | DIV2 | DIV3 |
| | GOOD | BAD | GOOD | GOOD |
| Starting Address of Divisions to Number of Divisions <4 Divisions> | Information For Four Consecutive Addresses | | | |
| Address<12:2> | DIV0 | DIV1 | DIV2 | DIV3 |
| | GOOD | BAD | BAD | BAD |

(56) References Cited

U.S. PATENT DOCUMENTS

| | | | |
|---|---|---|---|
| 2009/0161429 A1* | 6/2009 | Chen | G11C 29/824 365/185.09 |
| 2009/0273986 A1* | 11/2009 | Cernea | G11C 29/846 365/189.05 |
| 2011/0231736 A1* | 9/2011 | Toops | G11C 7/02 714/768 |
| 2012/0182816 A1* | 7/2012 | Ide | G11C 29/808 365/200 |
| 2012/0297245 A1* | 11/2012 | Li | G11C 29/00 714/15 |
| 2013/0242655 A1* | 9/2013 | Tsai | G11C 16/06 365/185.09 |
| 2014/0140153 A1* | 5/2014 | Son | G11C 29/806 365/200 |
| 2018/0047460 A1* | 2/2018 | Moschiano | G11C 29/846 |
| 2020/0097209 A1* | 3/2020 | Zhou | G06F 11/073 |

\* cited by examiner

| Number of Divisions | Rule |
|---|---|
| 2 Divisions | Remove Lower Most Bit |
| 3 Divisions | Lower Two Bits Increment From 0 to 2 |
| 4 Divisions | Remove Two Lower Most Bits |
| 5 Divisions | Lower Three Bits Increment From 0 to 4 |
| 6 Divisions | Lower Three Bits Increment From 0 to 5 |
| 7 Divisions | Lower Three Bits Increment From 0 to 6 |
| 8 Divisions | Remove Three Lower Most Bits |

FIG. 6

| Old CRD Architecture | |
|---|---|
| 0 | Address<12:0> |
| 1 | Address<12:0> |
| 2 | Address<12:0> |
| 3 | Address<12:0> |
| 4 | Address<12:0> |
| 5 | Address<12:0> |
| 6 | Address<12:0> |
| 7 | Address<12:0> |
| ... | ... |
| 103 | Address<12:0> |
| 104 | Address<12:0> |
| 105 | Address<12:0> |
| 106 | Address<12:0> |
| 107 | Address<12:0> |
| 108 | Address<12:0> |
| 109 | Address<12:0> |
| 110 | Address<12:0> |

FIG. 7

| New CRD Architecture: Four Divisions | | |
|---|---|---|
| 0 | New Address<12:2> | Match Bit<3:0> |
| 1 | New Address<12:2> | Match Bit<3:0> |
| 2 | New Address<12:2> | Match Bit<3:0> |
| 3 | New Address<12:2> | Match Bit<3:0> |
| 4 | New Address<12:2> | Match Bit<3:0> |
| 5 | New Address<12:2> | Match Bit<3:0> |
| 6 | New Address<12:2> | Match Bit<3:0> |
| 7 | New Address<12:2> | Match Bit<3:0> |
| ... | ... | |
| 103 | New Address<12:2> | Match Bit<3:0> |
| 104 | New Address<12:2> | Match Bit<3:0> |
| 105 | New Address<12:2> | Match Bit<3:0> |
| 106 | New Address<12:2> | Match Bit<3:0> |
| 107 | New Address<12:2> | Match Bit<3:0> |
| 108 | New Address<12:2> | Match Bit<3:0> |
| 109 | New Address<12:2> | Match Bit<3:0> |
| 110 | New Address<12:2> | Match Bit<3:0> |

FIG. 8A

| New Address Format | Match <3:0> | | | |
|---|---|---|---|---|
| Starting Address of Divisions to Number of Divisions <4 Divisions> | Information For Four Consecutive Addresses | | | |
| | DIV0 | DIV1 | DIV2 | DIV3 |
| Address<12:2> | GOOD | BAD | BAD | GOOD |
| Starting Address of Divisions to Number of Divisions <4 Divisions> | Information For Four Consecutive Addresses | | | |
| | DIV0 | DIV1 | DIV2 | DIV3 |
| Address<12:2> | GOOD | BAD | GOOD | GOOD |
| Starting Address of Divisions to Number of Divisions <4 Divisions> | Information For Four Consecutive Addresses | | | |
| | DIV0 | DIV1 | DIV2 | DIV3 |
| Address<12:2> | GOOD | BAD | BAD | BAD |

FIG. 8B

New CRD Architecture: Five Divisions

| | | |
|---|---|---|
| 0 | New Address<12:3> | Match Bit<4:0> |
| 1 | New Address<12:3> | Match Bit<4:0> |
| 2 | New Address<12:3> | Match Bit<4:0> |
| 3 | New Address<12:3> | Match Bit<4:0> |
| 4 | New Address<12:3> | Match Bit<4:0> |
| 5 | New Address<12:3> | Match Bit<4:0> |
| 6 | New Address<12:3> | Match Bit<4:0> |
| 7 | New Address<12:3> | Match Bit<4:0> |
| | ... | |
| | ... | |
| | ... | |
| 103 | New Address<12:3> | Match Bit<4:0> |
| 104 | New Address<12:3> | Match Bit<4:0> |
| 105 | New Address<12:3> | Match Bit<4:0> |
| 106 | New Address<12:3> | Match Bit<4:0> |
| 107 | New Address<12:3> | Match Bit<4:0> |
| 108 | New Address<12:3> | Match Bit<4:0> |
| 109 | New Address<12:3> | Match Bit<4:0> |
| 110 | New Address<12:3> | Match Bit<4:0> |

FIG. 9A

| New Address Format | | | Match <4:0> | | | |
|---|---|---|---|---|---|---|
| Starting Address of Divisions to Number of Divisions <5 Divisions> | | Information For Four Consecutive Addresses | | | | |
| | | DIV0 | DIV1 | DIV2 | DIV3 | DIV4 |
| Address<12:3> | | GOOD | BAD | BAD | GOOD | GOOD |
| Starting Address of Divisions to Number of Divisions <4 Divisions> | | Information For Four Consecutive Addresses | | | | |
| | | DIV0 | DIV1 | DIV2 | DIV3 | DIV4 |
| Address<12:2> | | GOOD | BAD | GOOD | GOOD | GOOD |
| Starting Address of Divisions to Number of Divisions <4 Divisions> | | Information For Four Consecutive Addresses | | | | |
| | | DIV0 | DIV1 | DIV2 | DIV3 | DIV4 |
| Address<12:2> | | GOOD | BAD | BAD | BAD | BAD |

FIG. 9B

| New CRD Architecture: Four Divisions | |
|---|---|
| 0 | New Address<12:2> \| Match Bit<3:0> |
| 1 | New Address<12:2> \| Match Bit<3:0> |
| 2 | New Address<12:2> \| Match Bit<3:0> |
| 3 | New Address<12:2> \| Match Bit<3:0> |
| 4 | New Address<12:2> \| Match Bit<3:0> |
| 5 | New Address<12:2> \| Match Bit<3:0> |
| 6 | New Address<12:2> \| Match Bit<3:0> |
| 7 | New Address<12:2> \| Match Bit<3:0> |
| ... | ... |
| 103 | New Address<12:2> \| Match Bit<3:0> |
| 104 | New Address<12:2> \| Match Bit<3:0> |
| 105 | New Address<12:2> \| Match Bit<3:0> |
| 106 | New Address<12:2> \| Match Bit<3:0> |
| 107 | New Address<12:2> \| Match Bit<3:0> |
| 108 | New Address<12:2> \| Match Bit<3:0> |
| 109 | New Address<12:2> \| Match Bit<3:0> |
| 110 | New Address<12:2> \| Match Bit<3:0> |

FIG. 10A

| New CRD Architecture: Four Divisions | | |
|---|---|---|
| 0 | New Address<12:2> | Match Bit<3:0> |
| 1 | New Address<12:2> | Match Bit<3:0> |
| 2 | New Address<12:2> | Match Bit<3:0> |
| 3 | New Address<12:2> | Match Bit<3:0> |
| 4 | New Address<12:2> | Match Bit<3:0> |
| 5 | New Address<12:2> | Match Bit<3:0> |
| 6 | New Address<12:2> | Match Bit<3:0> |
| 7 | New Address<12:2> | Match Bit<3:0> |
| ... | ... | |
| 103 | New Address<12:2> | Match Bit<3:0> |
| 104 | New Address<12:2> | Match Bit<3:0> |
| 105 | New Address<12:2> | Match Bit<3:0> |
| 106 | New Address<12:2> | Match Bit<3:0> |
| 107 | New Address<12:2> | Match Bit<3:0> |
| 108 | New Address<12:2> | Match Bit<3:0> |
| 109 | New Address<12:2> | Match Bit<3:0> |
| 110 | New Address<12:2> | Match Bit<3:0> |

| New CRD Architecture: Four Divisions | | |
|---|---|---|
| 0 | New Address<12:2> | Match Bit<3:0> |
| 1 | New Address<12:2> | Match Bit<3:0> |
| 2 | New Address<12:2> | Match Bit<3:0> |
| 3 | New Address<12:2> | Match Bit<3:0> |
| 4 | New Address<12:2> | Match Bit<3:0> |
| 5 | New Address<12:2> | Match Bit<3:0> |
| 6 | New Address<12:2> | Match Bit<3:0> |
| 7 | New Address<12:2> | Match Bit<3:0> |
| ... | ... | |
| 103 | New Address<12:2> | Match Bit<3:0> |
| 104 | New Address<12:2> | Match Bit<3:0> |
| 105 | New Address<12:2> | Match Bit<3:0> |
| 106 | New Address<12:2> | Match Bit<3:0> |
| 107 | New Address<12:2> | Match Bit<3:0> |
| 108 | New Address<12:2> | Match Bit<3:0> |
| 109 | New Address<12:2> | Match Bit<3:0> |
| 110 | New Address<12:2> | Match Bit<3:0> |

FIG. 10B

COLUMN REDUNDANCY DATA ARCHITECTURE FOR YIELD IMPROVEMENT

FIELD OF INVENTION

The present invention relates to data architectures for defect correction in non-volatile memory circuits. More specifically, the invention relates to improved data architectures for reducing combinational delay in column redundancy logic.

BACKGROUND

Non-volatile memory technologies such as erasable programmable read-only memory (EPROM) and electrically erasable programmable read-only memory (EEPROM) are widely used by consumers and institutional users alike. In particular, various types of EPROM and EEPROM such as NOR and NAND flash memory have been adapted for use in portable data storage devices due to inherent characteristics that also promote speed (particularly for read operations), reduce power consumption, and allow such devices to carry a smaller form-factor.

At an elementary level, non-volatile memory devices, including those using NOR and NAND-type flash technology, include one or more memory chips having multiple arrays of memory cells. The memory arrays may have associated decoders and circuits for performing read, write, and erase operations. Memory cells within the arrays may be arranged in horizontal rows and vertical columns. Each row may be addressed by a word line, and each column may be addressed by a bit line. Data may be loaded into columns of the array using a series of data busses. Each column may hold a predefined unit of data, for instance, a word encompassing two bytes of information.

Non-volatile memory chips may be susceptible to failures of the memory array. Defects in a single bit, in a row, in a column, or both rows and columns may arise during the manufacturing process or during the lifespan of the chip. For example, latch failures, bit line shorts, and word lines shorts may all affect the ability of a memory chip to reliably store data or read-out data that has already been stored.

Avenues for addressing memory defects may include various types of redundancy schemes. These ideally minimize the impact of such defects, though it may not be possible to address all defects without limiting the speed of read/write operations. In such cases, at the manufacturing stage, it may be necessary to discard chips having too many defects. This may have the effect of reducing production yield, or the ratio of the number of functional chips to the total number of chips produced. Thus, improvements to redundancy schemes that do not unduly compromise operational speed while still providing adequate assurances of reliability are desirable.

SUMMARY

Methods and circuits for storing column redundancy data are provided herein. A circuit may comprise a column redundancy data array, which may store an address and a plurality of match bits. A first portion of bits of the address may reference a range of columns of a memory array and a second portion of bits of the address may reference a division of the memory array in which a column of the range of columns is located. Each of the match bits may indicate whether one of the columns of the range of columns is defective.

BRIEF DESCRIPTION OF THE DRAWINGS

FIG. 6 provides an example of specific rules by which the addresses may be structured in a division-based architecture;

FIG. 7 provides a tabular representation of an array of individual column data as might be stored in latches of a CRD plane;

FIG. 8A provides a tabular representation of an array of bad column information for a division-based architecture in which a four-division system is used;

FIG. 8B provides a detailed representation of match bits as stored in CRD latches;

FIG. 9A provides a tabular representation of an array of bad column information for a division-based architecture in which a five-division system is used;

FIG. 9C depicts the match bit information as may be used to drive a bad division counter;

FIG. 10A portrays the improved operation of comparison logic when using the division-based CRD architecture;

FIG. 10B shows the compounded benefit of the division-based architecture when performing multiple horizontal comparisons at once.

DETAILED DESCRIPTION OF THE PREFERRED EMBODIMENTS

Figure 1:
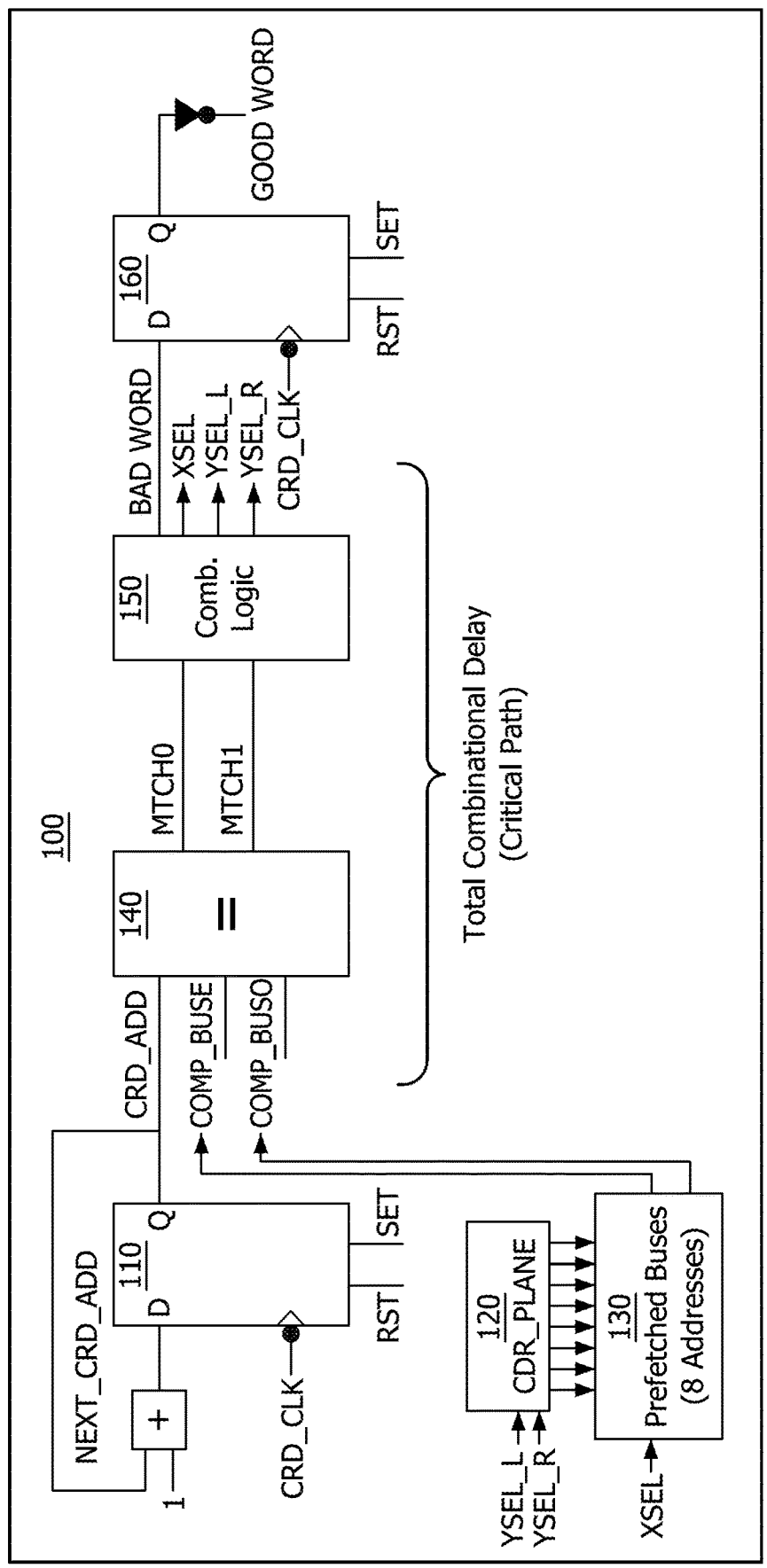
FIG. 1 depicts column redundancy logic configured to perform a dynamic column skip calculation.

Memory redundancy schemes may offer an effective solution for addressing memory array failures that arise during the manufacturing phase or after. Though column redundancy schemes are discussed specifically herein, schemes may be developed for both columns and rows, or a combination of both. A column redundancy scheme may include a "shifting" or "skipping" operation and an arrangement by which a skipped column may be replaced by a spare column. As used herein, the terms "defective column" and "bad column" may be used interchangeably to refer to columns in which failures have occurred. In a column skipping operation, the locations of bad columns in physical memory may be detected, recorded, and ignored during read and write operations. In embodiments providing for spare columns, a particular number of redundant columns may be made available to repair column failures that occur there. In the event a failure is detected in a given column, a spare column may be assigned to replace the defective column, and data that would be written to, or read from, the defective column may instead be written to, or read from, the corresponding spare column.

In some embodiments of a memory array, the cells may be further arranged in a plurality of divisions. A division may be a higher-level abstraction of the column. In one example, a division may include a set of 16 columns, though it may be appreciated that other embodiments of a division may have a greater or lesser number of columns. A set of divisions may also be coextensive with the structure of an array. For instance, the divisions may collectively encompass all columns of the array such that all of the columns in the array are divided among each of the divisions, and the word lines of each row may span across all divisions of the array.

User data may be stored in each of the divisions of the array in a sequential manner. User data may be segmented into words of two bytes in length, and each of the words may have consecutive logical addresses. Successive words may be fed into columns of each division upon transitioning of a clock signal. For instance, for a memory cell array having five divisions DIV0, DIV1, DIV2, DIV3, and DIV4, a first word may be loaded into a first column of DIV0, a second word may be loaded into a first column of DIV2, and so on until the words of the data are distributed among all of the columns. Upon storing a word in the last division DIV4, a next word of the data may be stored in a second column of the division DIV0, and the following words of the data may be stored in second columns of the divisions accordingly. Each of the divisions of the memory array may have peripheral circuitry enabling columns of each division to be accessed. For example, data busses may permit transfer of the user data into or latches of the columns. It may be appreciated that other embodiments may provide for an array having greater or fewer divisions.

During manufacturing, testing of memory chips may be performed to assess the presence of defects. Upon determining the location of defects in the memory, for example, at a particular column, data may be generated to track the addresses where such defects arise. In some embodiments, the data may include logical addresses of the defective column, and/or physical addresses of the defective column. This data may be stored for example, in an array of latches on the same memory chip, in a partitioned area of the chip, or in some other external memory location. In embodiments, the defect data may be generated via on-chip logic by using a Built-In-Self-Test (BIST) mechanism, which may provide a chip with defect detection capabilities useable after shipping. In some embodiments, the memory defect data may be generated using both the defect data present during shipping as well as defect data generated during the operational lifetime of the chip.

After column defects are detected and the corresponding bad column addresses are latched, the column redundancy scheme may be used to ignore bad addresses during read or write operations. The column skipping process may be divided into two parts: (1) calculating a number of initial columns to skip, and (2) subsequently determining, on a dynamic basis with respect to a clock, to skip over additional columns based on the latched bad column data. Paragraphs that immediately follow provide an overview of the initial skip and dynamic skip calculations. It should be noted, however, that in some embodiments the column skipping process may include just one of the above parts.

In calculating the initial skip value, the initial number of columns to be skipped may be determined based on a number of bad columns in a sector of memory cells. For example, an input address at which a controller wishes to read-out user data or write user data may be shifted based on a bad column index. The bad column index may be determined based on a number of bad column addresses stored within a column redundancy data (CRD) array. Logic configured to perform this operation may compare the input address with bad column addresses stored at each of the latches. The logic may determine the first latch for which the stored bad column address is greater than the input address, and the index corresponding to this latch may be used to advance a starting address for which to begin performing the dynamic skipping procedure. The comparison of the incoming address with the bad column addresses may be performed by embedded circuitry at each of the latches, or it may be performed by a centralized controller or other dedicated circuitry located, for example, in a column redundancy block.

During the dynamic skip procedure, the starting column address may be compared against one or multiple stored bad column addresses. The starting column address may be incremented dynamically based on a clock signal such that, at each successive time interval, a new address is delivered to the comparison logic. The incremented starting column addresses may have consecutive logical column addresses that may not correspond to consecutive physical locations in memory. The starting column address may be incremented automatically regardless of whether a match between the starting column address and one of the stored bad column addresses was revealed.

Upon incrementing, the comparison logic may compare the starting column address to stored addresses of the bad columns. The stored bad column addresses may be read into the comparison logic from an array of CRD latches using row and column pointers and busses. The pointers may then operate in concert to select the appropriate latch storing a bad column address. Taking into account whether either of the compared bad column addresses matches the starting address, the pointers may be updated to select a new bad column address or addresses for comparison in the following cycle.

FIG. 1 provides a broad overview of a column redundancy system 100 configured to perform the dynamic skip calculation. As shown, the column redundancy system 100 may be driven by the clock signal CRD_CLK. Following the initial skip calculation, a starting column address CRD_ADD to be compared against the stored bad column addresses may be incremented dynamically based on the CRD_CLK signal such that at each successive time interval, a new address is delivered to the comparison logic. Flip-flop 110 may be configured to pass the incremented starting address CRD_ADD to the comparator block 140 at a transition of the clock signal.

The comparator block 140 may include one or more comparators depending on the configuration of the column redundancy circuit. Upon incrementing, the comparators of the comparator block 140 may compare CRD_ADD to the stored addresses of bad columns. The stored bad column addresses may be read into the comparison logic from an array of CRD latches, shown at CRD_PLANE, using a series of row and column pointers YSEL_L, YSEL_R, XSEL, and the prefetch busses 130. In particular, the column pointers may be used to select one or more latches storing bad column addresses.

In some embodiments, CRD_ADD may be compared against one or multiple bad column addresses at once, depending upon of the number of column addresses that may be skipped or the number of column redundancies supported. The comparison logic, upon determining whether the CRD is the same as one of the bad column addresses, may generate outputs equal to the number of bad column addresses used in the comparison. Based on the generated outputs, it may be determined that the address is bad and to skip over that column. In some embodiments, the comparison logic may determine that the address is not bad and that a read or write operation may be performed there.

In the embodiment depicted in FIG. 1, it may be assumed that two column addresses may be skipped, though in other embodiments, the maximum number of columns may be skipped may be fewer or greater. Thus, as shown, two bad column addresses—one corresponding to an even-numbered column and the other corresponding to an odd-numbered column—are compared to the CRD column address at any given clock cycle. In some embodiments, the maximum number of columns addresses that may be skipped may be indicated as a quota. For example, in some cases, a column redundancy system may permit up to two column addresses to be skipped for every five consecutive logical addresses.

The comparator 140, upon determining whether CRD_ADD is the same as one of the bad column addresses, may generate a number of match outputs. The number of match outputs may be equal to the number of bad column addresses used in the comparison. The match outputs may be one-bit outputs such that a match between the CRD column address and one of the bad column addresses results in a one-bit output of '1' for the corresponding bad column. For example, in the embodiments pictured in FIG. 1, the comparator generates MTCH0 and MTCH1 following the comparison, where MTCH0 corresponds to an odd-numbered column and MTCH1 corresponds to an even-numbered column. In the case the comparator determines that the CRD column address is the same as the address stored at the odd-numbered CRD latch, the comparator may output MTCH0=1 and MTCH1=0. In the case the comparator determines the CRD column address is the same as the address stored at the odd-numbered CRD latch, the comparator may output MTCH0=0 and MTCH1=1. In the event neither bad column address matches the CRD column address, the comparator may output MTCH0=0 and MTCH1=0.

Bad column addresses to which CRD_ADD is compared may be selected from a series of latch units in CRD_PLANE 120 using row pointers YSEL_L and YSEL_R. Each latch unit may be located at an intersection between a row and a column, and each latch unit may store a single column address. Importantly, the comparator 140 may compare the incoming CRD column address with two bad column addresses in an iterative fashion. Addresses for two rows may be read from the CRD_PLANE 120 at a given time, and each row may contain four columns. Thus, a series of eight selected addresses may be prefetched using prefetch busses 130, and two latches among the rows, one even-numbered and one odd-numbered, may be selected using the column pointer XSEL. The addresses stored at the even-numbered and odd-numbered latches may be communicated to the comparator 140 by COMP_BUSE and COMP_BUSO, respectively.

Following comparison of CRD_ADD with COMP_BUSE and COMP_BUSO, MTCH0 and MTCH1 may be processed by combinational logic 150 to update the row and column pointers. In addition, the combinational logic 150 may generate an output BAD_WORD in the case either MTCH0 or MTCH1 are high. The output may be latched at 160 for use in other processes.

In some embodiments, bad column addresses stored in CRD latches may be indexed addresses converted from non-indexed column addresses for use in the comparison operation. The bit sequences used to indicate indexed and non-indexed addresses may be expressed by a range of bits, <X:Y>. A bit range <X:Y> may indicate a position of a most significant bit (or a left-most bit), X, and a position of the least significant bit (or a right-most bit), Y.

For a non-indexed address mode, an entire bit sequence may be used to indicate the address of each column individually. By way of illustration, a bit sequence corresponding to a non-indexed column address of length 14 bits may be indicated by the range <13:0>, where the most significant bit of the transferred bit sequence is at position 13, and the least significant bit of the sequence is at position 0. In a division-based CRD scheme, non-indexed addresses may increment without regard to the position of the columns within the divisions.

For an indexed address, the configuration of the bit sequence may be different. In a division-based CRD scheme where the columns of an array are divided among multiple divisions, a first portion of the address bits may be used to refer to a position of a column without specifying the division in which the column resides, while a second range of the bit sequence may provide the division information. Using the example of a 14-bit address as introduced above in the context of a five-division scheme, the position of the column may be indicated by the 11 most significant bits <13:3> and the 3 least significant bits <2:0> may indicate one of the five divisions of the array in which the column resides.

Additionally, the indexed address may be used to refer to a range of consecutive columns among the divisions. As described in paragraphs above, data may be read from or written to consecutive columns among the divisions. For instance, when a read or write operation is performed, data may be converted into a number of packets equal to the number of divisions, and each packet may have a number of bits corresponding to the length of a column word. Each packet may be loaded into or read from an array at once. Thus, given an array with five divisions and column word length of 16 bits, a total of 80 bits may be written to or read from the array in a single clock cycle. Furthermore, the location or column address at which data is to be read or written may be determined based on the initial address. For example, a first 16-bit packet may be loaded into a first column, a second 16-bit packet may be loaded into a second column, and so on. Passing the column position using the starting column address only, e.g. a first portion of the address bits, may allow loading of multiple column addresses in a single clock cycle. Data from multiple-column address may include, for example, one column of each successive division. Accordingly, the indexed addresses may facilitate comparisons between one or more incoming column address and multiple successive column addresses.

To perform the indexing operation, one or more conversion formulas or equations may be applied to the non-indexed addresses. For instance, the conversion formula may perform integer division on the non-indexed address using the number of divisions in the array to determine the starting or initial address at which the data is located. This information may be indicated by a first bit range, for example, as described in examples above. Further, the formula may use a modulus or a remainder of the integer division operation to determine a corresponding division for each column. Such information may be indicated by a second bit range as described above.

Figure 2:
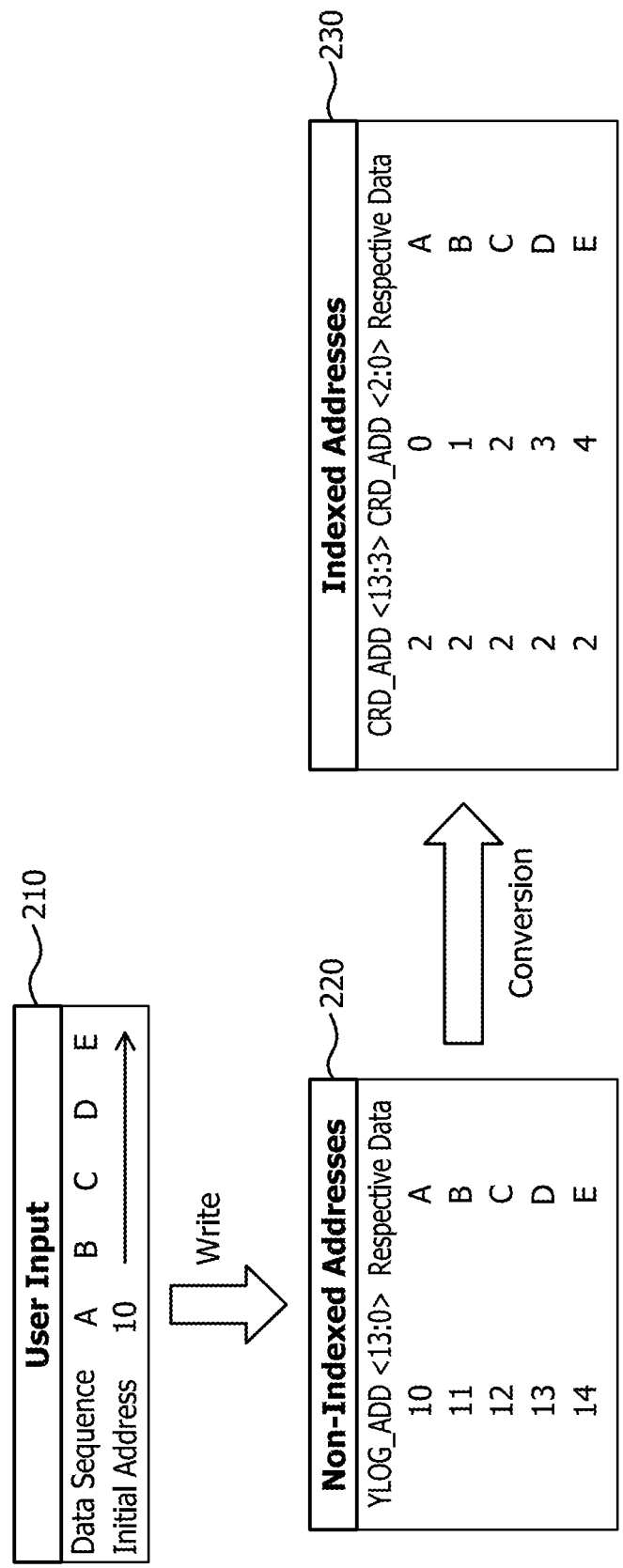
FIG. 2 portrays an example of an indexing operation for addresses of a five-division array.

FIG. 2 portrays an example of an indexing operation for addresses of a five-division array. As shown, at 210, user data may be fed into a memory circuit, and packetized according to the number of divisions and the column word length as indicated above. Such packets may be loaded into a memory array beginning at a starting column address. For simplicity, the starting column address 10 is expressed here in decimal form, and the column address 10 may store a first element of a data sequence, 'A'. Following a write operation, subsequent packets data may be loaded into columns substantially as shown at 220. Remaining elements of the data sequence 'B', 'C', 'D', and 'E' may be written to successive column addresses 11, 12, 13, and 14. The non-indexed addresses may be given by YLOG_ADD, which may comprise a 14-bit sequence <13:0>.

As shown at 230, the non-indexed addresses may be converted into indexed addresses via application of two conversion formulas. As depicted, the conversion formula may perform integer division on the non-indexed address, YLOG_ADD <13:0> to obtain an initial or starting column address to be stored at CRD_ADD<13:3>. In the case of a five-division system as shown, the non-indexed address may be divided by 5. A first conversion formula may be expressed as CRD_ADD<13:3>=YLOG_ADD/5. For non-indexed column addresses of 10, 11, 12, 13, and 14, respective data 'A', 'B', 'C', 'D', and 'E' may each therefore be respectively stored in the third column, 2, of each division.

A second conversion formula may be used to indicate such division information for each respective data element of the stored data sequence. As shown, the division data may be determined by performing a modulo-N operation on the non-indexed address, where N is equal to the number of divisions in the array. Thus, the second conversion formula may be expressed as CRD_ADD<2:0>=YLOG_ADD % 5. As shown, for non-indexed column addresses of 10, 11, 12, 13, and 14, the respective divisions in which 'A', 'B', 'C', 'D', and 'E' are stored may be indicated by CRD_ADD<2:0>.

In another embodiment characterized by a four-division array, the formulas may be expressed in a similar fashion. For example, a first conversion formula may be expressed as CRD_ADD<13:2>=YLOG_ADD/4, and a second formula may be expressed as CRD_ADD<1:0>=YLOG_ADD % 4. In this example, as the array has four divisions rather than five, only two bits <1:0> are needed to indicate the division information for each column address. It may be appreciated that a greater or lesser number of bits may be used to indicate such information for arrays having a greater or lesser number of divisions.

Figure 3:
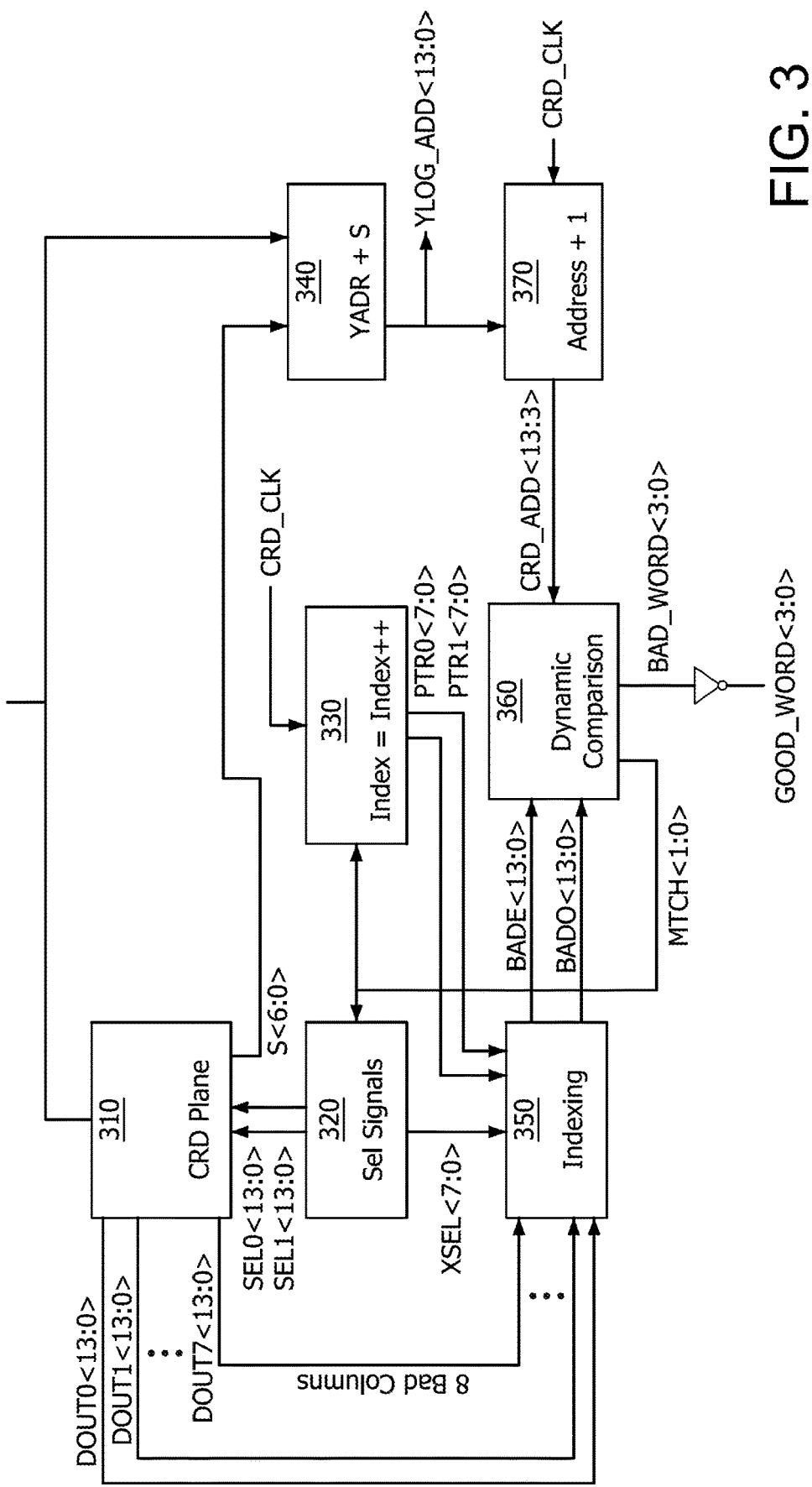
FIG. 3 provides a detailed example of a column redundancy system showing the flow of address and pointer data during both initial skip and dynamic skip calculation steps.

FIG. 3 provides a more detailed example of a column redundancy circuit showing the flow of address and pointer data during both the initial skip calculation and the dynamic skip calculation. As exemplified in FIG. 3, bit sequences corresponding to each of the addresses and pointers may be communicated through the column redundancy circuit, shown schematically by arrows.

As shown, an incoming address YADR<13:0> may be input to the CRD plane 310. The CRD plane may determine a number of bad column addresses, S<6:0>, in the bad column array that precede the incoming address, and provide this initial skip value to initial skip logic 340. The initial skip logic 340 may increment YADR<13:0> by the number of bad column addresses S to obtain a starting address, YLOG_ADD<13:0>. Using the clock signal CRD_CLK, the address may be converted to generate CRD_ADD<13:3> via an address indexing process such as one described in paragraphs above.

Similarly as described in paragraphs above, a comparator module 360 may compare CRD_ADD<13:3> with bad column addresses stored at selected latches in the CRD plane 310. A selection module 320 may be configured to select two rows from the CRD plane 310 using selection signals SEL0<13:0> and SEL1<13:0>. The full address stored at each latch of the two rows may be read-out by busses DOUT0<13:0> through DOUT8<13:0> for indexing. The selection circuitry 320 may be configured to indicate a column pointer XSEL<7:0> to select from the read-out addresses. As shown in FIG. 3, two addresses, for example, may be selected. Subsequently, an odd column pointer PTR0<7:0> and an even column pointer PTR1<7:0> may be added to the address or addresses selected from among DOUT0 to DOUT8 to generate even and odd-numbered bad column addresses BADE<13:0> and BADO<13:0> for comparison to CRD_ADD<13:3>. Depending on whether a match is found for either the even or odd bad column addresses, the MTCH<1:0> field may be output by the comparison logic, indicating to the selection module 310 to send updated select signals towards the CRD plane and prefetch data from a next latch or latches, and indicating to an index incrementor module 330 to increment the even and odd column indexing pointers PTR0<7:0> and PTR1<7:0>.

Figure 4A:
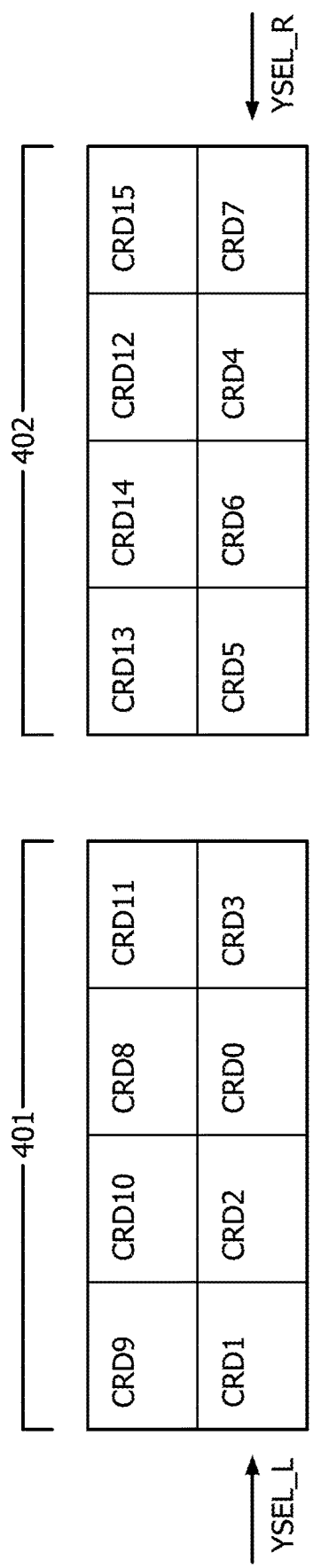
FIG. 4A depicts the arrangement of latches in the CRD plane storing bad column data.

FIG. 4A depicts the arrangement of latches in the CRD plane storing the bad column data. As shown, the plane may include multiple rows, each containing eight CRD latches. A first row may contain latches CRD0 through CRD7, while a second may contain latches CRD8 through CRD 15. Though not shown in FIG. 4A, the CRD latches themselves may be identified by CRD_LAT_UNIT, e.g., CRD_LAT_UNIT0 through CRD_LAT_UNIT15. Each of the rows of the CRD plane may increment from the bottom row of the CRD plane, moving upwards. For example, a bottom row may be referenced as row 0; the row above may be referenced as row 1; the row above may be referenced as row 3, and so on.

There may be two halves of the CRD plane: a left half 401 providing the first four latches of each row, and a second half 402 providing the second four latches of each row. As introduced above with respect to FIG. 1, row pointers YSEL_L and YSEL_R may correspond, respectively, to the left and right halves 401 and 402 of the CRD plane. The latches within each half of the rows may or may not have a sequential physical arrangement corresponding to a sequential ordering of the stored addresses. For example, as shown in FIG. 4A, the bad column addresses stored in the first four latches may be distributed, from left to right, as CRD1, CRD2, CRD0, and CRD3. The data stored in the second four latches may be distributed, from left to right, as CRD7, CRD4, CRD6, and CRD5.

In some embodiments, the data may be distributed in increasing numerical order from left to right or from right to left, for instance. In some embodiments, the number of CRD latches located in the CRD plane may be greater or fewer, as may the number of rows or columns. Additionally, the CRD plane may be sectioned into thirds, quarters, or another conceivable number of sectors according to, for example, the configuration of the comparator, pointers, and/or the CRD address architectures. For instance, in a system designed to compare four bad column addresses to one given CRD column address, a CRD plane may conceivably be divided into four parts.

Figure 4B:
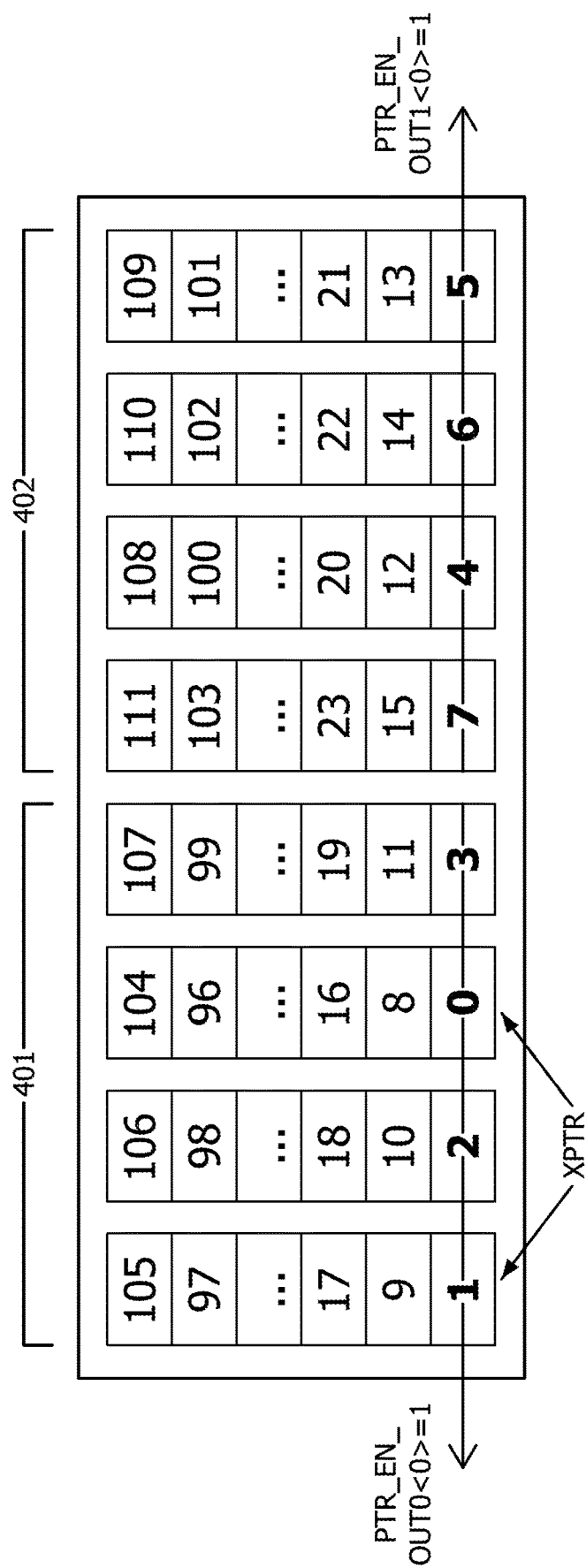
FIG. 4B portrays the functionality of row and column pointers during an initial time period of a read-out operation when a first two CRD latches are selected.
Figure 4C:
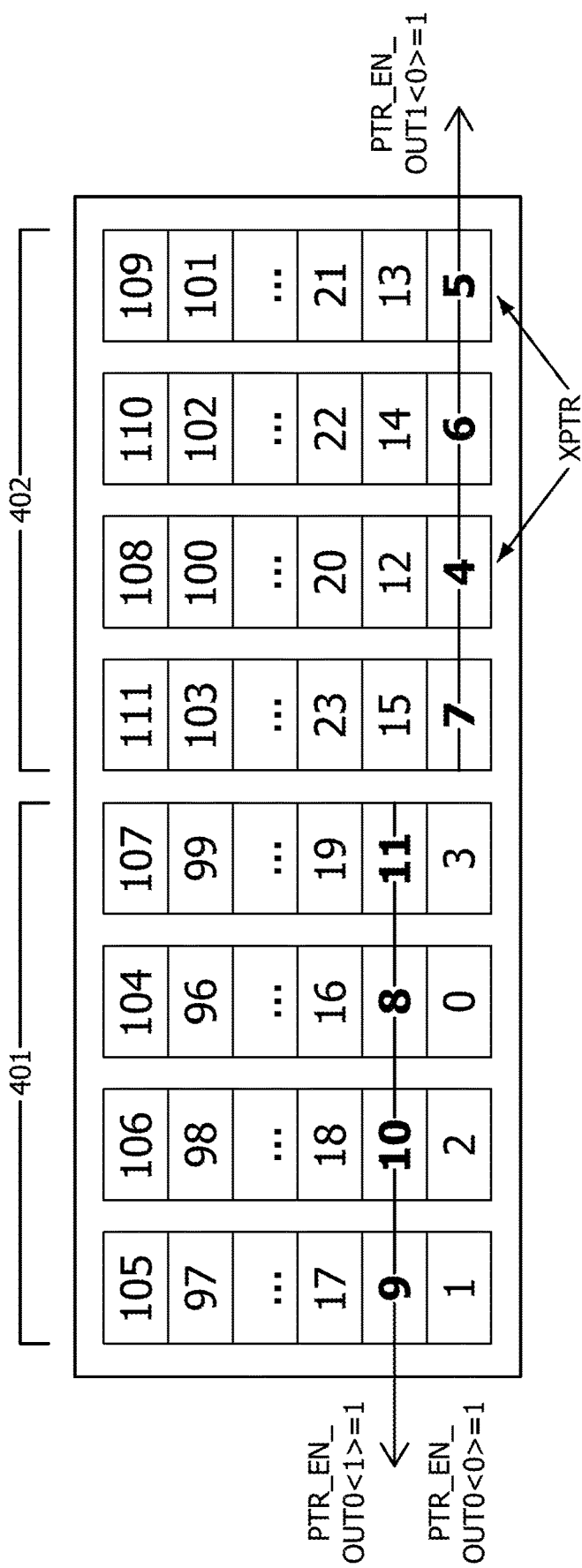
FIG. 4C depicts the operation of the row pointers when, in a later clock cycle, fifth and sixth CRD latches are selected.
Figure 4D:
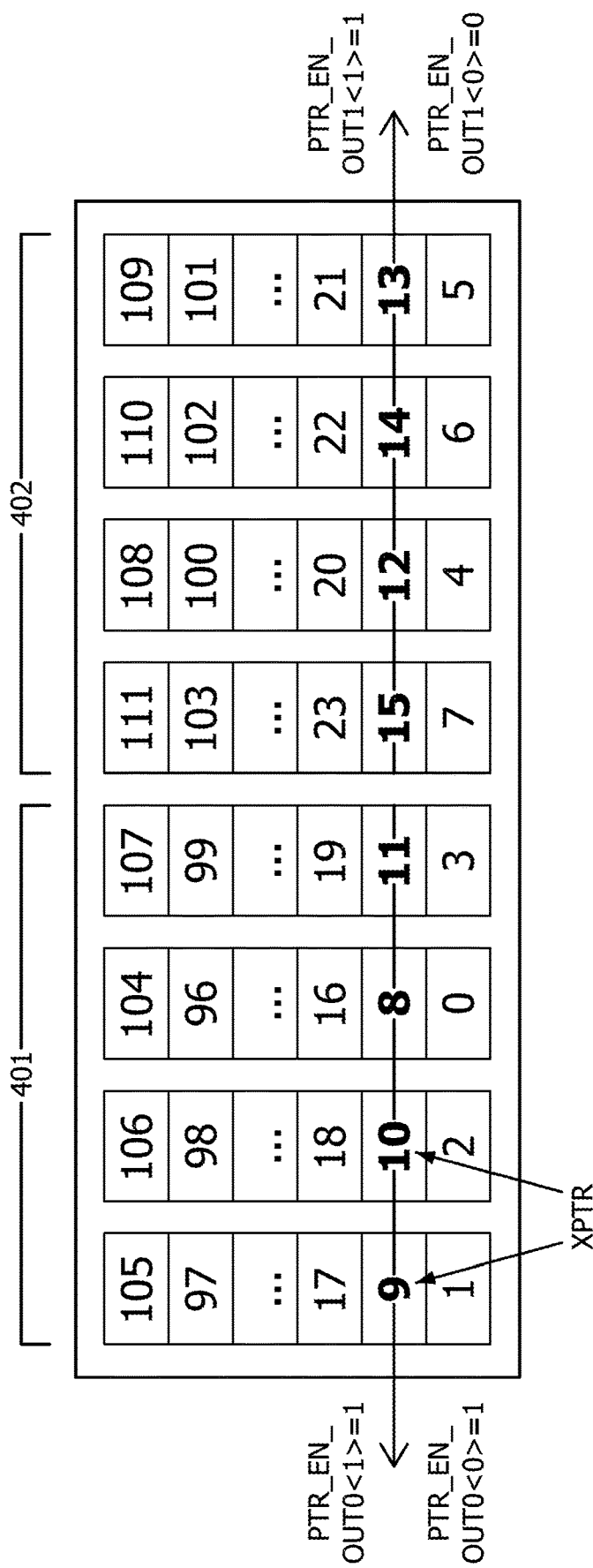
FIG. 4D depicts the operation of the row pointers when, in a later clock cycle, tenth and eleventh CRD latches are selected.

FIGS. 4B through 4D portray the functionality of the YSEL and XSEL pointers introduced in paragraphs above in the context of a read-out operation. In some embodiments, the YSEL_L and YSEL_R pointer data may include four-bit fields identifying latches within a left or right half of a particular row of a CRD plane. The pointer data may be decoded to obtain an address or range of addresses stored by the latches. For example, YSEL0_L<3:0> may be decoded to obtain PTR_EN_OUT0<13:0>, which may point to addresses in the left half of the first row of the CRD plane. YSEL0_R<3:0> may be decoded to obtain PTR_EN_OUT1<13:0>, which may point to addresses in the right half of the first row of the CRD plane. For instance, as shown in FIG. 3B, while PTR_EN_OUT0<0>=1, address data stored in CRD_LAT_UNIT0 through CRD_LAT_UNIT3 may be read-out, and while PTR_EN_OUT1<0>=1, address data in CRD_LAT_UNIT4 through CRD_LAT_UNIT7 may be read out.

The column pointer XSEL<7:0> may point to one or more columns at a given moment. The number of columns selected during a read-out operation may differ from the number of columns selected during a write operation. As shown in FIG. 4B, during the read-out operation, two columns may be indicated at one time. Additionally, XSEL may always indicate multiple numerically adjacent columns at a given time. For instance, at a given clock cycle, XSEL<0> and XSEL<1> may transition to high values, or, in another example, XSEL<1> and XSEL<2> may transition to high values. While XSEL<7:0> points to the pointer indexes 0 through 3, each of CRD_LAT_UNIT0 through CRD_LAT_UNIT7 may respectively output stored address data for the entire first row to busses DOUT0~7<13:0>. Subsequently, the DOUT busses may transfer the bad column address data stored by the selected latches for indexing. Another set of functions, CRD_COMP0 through CRD_COMP7, may add the corresponding pointer index to each of the bad column address data. Given, however, that only two columns (one even and one odd) are selected by XSEL, only the addresses for those two columns are output to COMP_BUSE/O<13:0> for comparison with CRD_ADD<13:0>.

FIG. 4C depicts the operation of the row pointers when, in a later clock cycle, XSEL<4> and XSEL<5> are high. As shown, PTR_EN_OUT0<1> may transition to a high state, and PTR_EN_OUT0<0> may transition to a low state. PTR_EN_OUT1<0> may remain in a high state. At this juncture, each of the latches CRD_LAT_UNIT4 through CRD_LAT_UNIT11 may output stored bad column addresses to CRD_COMP0 through CRD_COMP7 for addition with corresponding indexes, though only the combined addresses and indexes output from COMP4 and COMP5 are compared with CRD_ADD. As can be seen, when the value of XSEL<3> and MTCH1 are both high, at the next CRD_CLK cycle, PTR_EN_OUT0 will advance to next bit, selecting the next row of CRD latches in the left half of the CRD plane. Accordingly, toggling of one bit of the row pointer PTR_EN_OUT may trigger operation of four CRD_LAT_UNITs.

FIG. 4D depicts the operation of the row pointers when XSEL<9> and XSEL<10> are high. In a previous clock cycle, for example, when XSEL<7> & MTCH1 both are high, as shown, the column pointers may increment and the right half of the first row may no longer be selected; thus, PTR_EN_OUT1<0> may transition to a low state. At the same time, even though none of the CRD latches in the right half of the second row are selected, PTR_EN_OUT1<1> may transition to a high state and prefetch bad column data stored at those latches.

In embodiments, operation of the row pointers in preparing the stored bad column addresses for the dynamic skip calculation may limit the speed of a read or write operation. In one illustration considering the context of previously described FIGS. 4A through 4D, it may be assumed that latches CRD3 and CRD4 have been selected during a first clock cycle. Thus, PTR_EN_OUT0<0> and PTR_EN_OUT1<0> may be high. In the same cycle, CRD3 is determined to match CRD_ADD. In a second cycle, based on the determined match with CRD3, the XSEL pointers may increment to select CRD5 and CRD6. Since CRD3 and CRD4 are no longer selected, PTR_EN_OUT0<0> may go low and PTR_EN_OUT0<1> may go high, such that addresses from CRD8, CRD9, CRD10, and CRD11 can be pre-fetched. Assuming that subsequent matches are found for addresses stored at CRD5 and CRD6, after one cycle, it may be necessary that address data from CRD8 is ready for comparison with CRD_ADD. The timeframe in which the address data is to be prepared may be constrained, as CRD_ADD may be incoming at a high rate.

Figure 5:
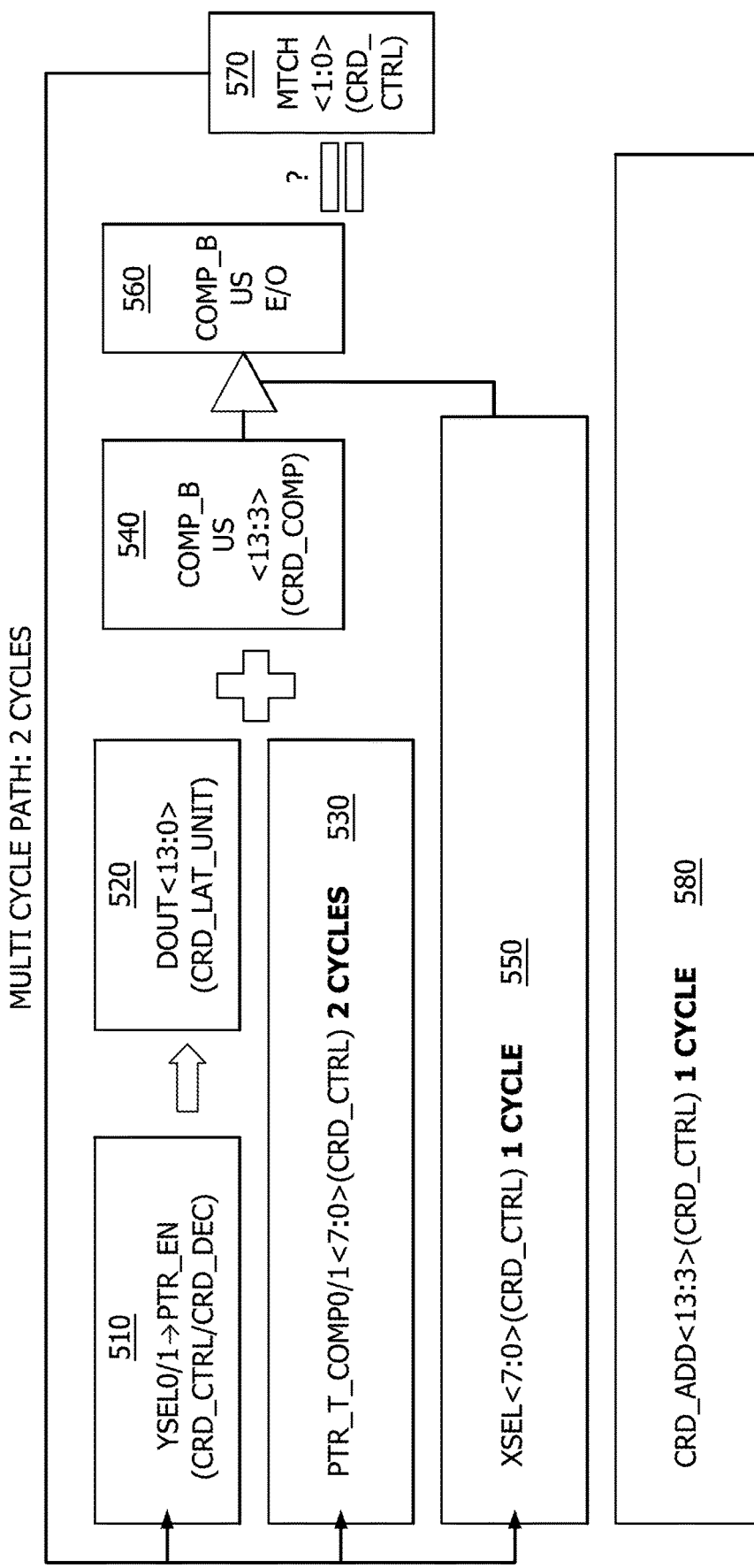
FIG. 5 is a flowchart showing the timing of the multi-cycle and single-cycle paths of the dynamic skip calculation process.

FIG. 5 depicts the timing of the dynamic skip calculation process on a step-by-step basis. As shown in FIG. 5, there may exist two paths: a single-cycle path characterized by the incrementing of CRD_ADD, and a multi-cycle path characterized by the selection and processing of bad column addresses to be compared with CRD_ADD. Iteration of CRD_ADD 580 may occur at each clock cycle. Similarly, at 550, updating of column pointers XSEL<7:0> may be performed in a single clock cycle based on the MTCH output shown at 570. Both of these steps may be completed in a single clock cycle.

The minimum cycle time for the multi-cycle path, on the other hand, may be longer, such as two clock cycles. In order to select and process the bad column data for comparison, at 510, YSEL pointer data may need to be decoded to enable the selected latches. At 520, the selected latches read-out their stored address data via DOUT<13:0>. At the same time, PTR_T_COMP0/1 may update index information for the rows, shown at 530. COMP_BUS<13:3>, shown by 540, may add row and column index information to the addresses received via DOUT<13:0> to obtain real addresses, forwarding real addresses for an even and an odd column to COMP_BUSE/O at 560 for comparison with CRD_ADD.

Delay may occur along the multi-cycle path in scenarios such as in FIGS. 4B through 4D, previously introduced and described above. This may be, for example, when three or more pairs of matches between stored and incoming addresses occur consecutively. When an XSEL pointer points to CRD_LAT_UNIT5 and CRD_LAT_UNIT6, PTR_EN_OUT0<1> may transition to a high state, and CRD_LAT_UNIT8 through CRD_LAT_UNIT11 may output their stored address data to the buses DOUT0 through DOUT3. If CRD_LAT_UNIT5 and CRD_LAT_UNIT6 match the current CRD_ADD, then the XSEL pointer may advance to CRD_LAT_UNIT7 and CRD_LAT_UNIT8. When the XSEL pointer points to CRD_LAT_UNIT8, it may be necessary to again update and decode the row pointers, instruct the appropriate latches to read-out their stored addresses, and add index information to those addresses. At least two cycles may be necessary for all of these steps to be carried out and for the comparison with CRD_ADD to be completed. This may present a timing bottleneck, since CRD_ADD may be incremented in just one cycle. In response, for some column redundancy systems, manufacturers may place restrictions on the maximum number of columns that may be skipped. In some embodiments, it may be stipulated that no more than two bad columns be present within a series of five consecutive columns. In other embodiments, it may be the case that no more than two bad columns are permitted within five given sectors of a memory array. If a chip does not meet these or similar requirements, the manufacturer may decide to reject the chip.

For column redundancy schemes similar to that described above, it may be desirable to reduce the combinational delay of the comparison logic, diminishing the bottlenecking effect on the incoming address data stream and, therefore, on the speed of read/write operations. By doing so, a manufacturer may be able to ignore or replace a greater number of bad columns without needing to reject the chip, increasing production yield.

In some solutions, a column redundancy scheme may leverage alternative data architectures to reduce the delay in comparison logic. For example, the column redundancy scheme may be applied on a per-division basis. A division may be said to be "defective" or "bad" if one or more columns corresponding to the division is defective or bad. This approach, and approaches derivable from it, may be referred to hereinafter as "division-based" approaches or schemes, distinct from the "column-based" schemes described above in which bad column data is generated for each individual column. For embodiments implementing spare or redundant columns, a certain number of redundant columns may be allocated within each division. For instance, where ten spare columns in total are permitted for a given array, and the array includes columns divided into five divisions, each division may have two spare columns allocated within it. It should be noted that this figure may be lesser or greater depending on the configuration of the column redundancy system. In a system employing a division-based column redundancy data architecture described in the following paragraphs, the system may support a greater maximum number of skipped column addresses. Therefore, in order to replace the greater number of skipped column addresses, in some cases, a greater number of redundant columns may be provided.

As described above for column redundancy schemes, implementation of the scheme may require testing to determine the number and locations of bad columns. In such a process, contextual information for each division may also be generated based on, for example, which columns belong to each division. The column redundancy data may include a starting address for a series of columns spanning across all divisions. The column redundancy data may also include a sequence of match bits indicating whether a column of the range within each division is defective, for which one match bit may be used for each division in the group. The address and match bit data may be stored in an array of CRD latches similar to those described for columns above and may be tabulated to represent the address and match data in separate fields. In some embodiments, the column addresses and the match bits may be stored in separate arrays. In other embodiments, the match bits may be stored in the same data latches as the address bits. A starting address for a given range of columns may use 13 bits, though it may be appreciated that the address data may use more or fewer bits in other embodiments. The number of bits used to indicate the address as well as the number of bits used to indicate the match data may depend on, for example, the number of divisions in the chip.

Column addresses as implemented in a division-based scheme may be determined according to one or more conversion formulas, which may be applied, for example, during an indexing stage of a CRD flow as described in paragraphs above. In other embodiments, the column addresses may be determined prior to storing the address data in latches of a CRD plane, prior to comparing In some embodiments, a rule or an arithmetic operation may be applied to one or more non-indexed column addresses such that a first portion of bits of an address provides a starting address for a group of columns spanning across the divisions of an array. The group of columns may include, for example, one column located at the starting address from each of the divisions. In some embodiments, the group of columns may not span across all divisions of the array. A second portion of bits of the address may indicate, for instance, match data for the columns within each division. The number of bits used for each of these portions of the address may depend on, for example, a number of columns in the array, number of divisions in the array, and/or the number of bits needed to indicate match data for the divisions (e.g., whether one match bit is allocated for each division, or whether the number of match bits is determined by a maximum number of potential matches).

FIG. 6 provides an example of specific rules by which the addresses may be structured. When the number of divisions is a power of two, for example, a starting address of a group of columns may be derived by dropping a number of bits equal to the power. For example, given a column redundancy scheme with four divisions using 13 bit addresses <12:0>, the first 11 bits <12:2> may be used to address the group of divisions, while the lower two bits <1:0> may provide a binary sequence corresponding to the individual column within each of the four divisions. When the number of divisions is not a power of two, the address may be expressed using a similar arrangement. For example, for a column redundancy scheme having five divisions, the first 10 bits <12:3> may provide a starting address for the series of five consecutive logical column addresses, while the lower three bits <2:0> may be used to address each of the five columns at each division. In this case, however, the address generation logic may cause the binary sequence of the three lower bits to only increment from 0 to 2.

FIGS. 7 and 8A depict embodiments of two column redundancy data architectures in which a memory array is divided into four divisions. Specifically, FIG. 7 provides a tabular representation of an array of individual column data as might be stored in latches of a CRD plane, described above in the context of FIGS. 4A through 4D. As shown, the column data may include 111 addresses, each having a total of 13 bits, though it may be appreciated that in other embodiments, a greater or lesser number of addresses may be stored, and a greater or lesser number of bits may be used for each address. Addresses for each individual column may be presented as separate rows of the table, therefore being stored at separate latches. As shown, only data for bad columns is stored, and therefore, the mere presence of the column address in the table may indicate that the column is defective. Such addresses may be compared against an incoming data address (e.g., CRD_ADD) and ignored during either the initial skip or dynamic skip processes described in paragraphs above.

FIG. 8A, in contrast, provides a tabular representation of an array of bad column information organized in accordance with the division-based approach described above. Here, first (i.e., starting) logical addresses for groupings of four columns are shown in the table. As in the previously-described CRD architecture, the array of column data might be stored in latches of a CRD array, and each starting address presented in a separate row of the table may be stored at a separate latch.

In accordance with the rule provided in previously described FIG. 6, for this four-division architecture, the first 10 bits are used to indicate the starting address of the consecutive columns. Additionally, as not all of the columns indicated by the range of addresses may be defective, the table may include a sequence of corresponding match bits for each starting address. As described above, the four match bits <3:0> used here may correspond to the four divisions in which the columns are located, and each bit may indicate whether an individual column located within each of the divisions is defective.

FIG. 8B provides a more detailed representation of the match bits as stored in CRD latches. As shown, the starting address of the range of columns spanning four divisions (DIV0, DIV1, DIV2, and DIV3) is indicated by address<12:2>. The match bits may indicate information for the four consecutive logical addresses corresponding to the columns of each division. For example, each of the four match bits may indicate whether the column located in each division is bad. Where DIV0 and DIV3 are not defective (i.e., the divisions are "good"), the first and the fourth match bits of the four-bit sequence may remain in a low state, 0. Where DIV1 and DIV2 are bad, the corresponding match bits may transition to a high state, 1. In other embodiments, the defective divisions may be indicated by a match bit value of 0, and the non-defective divisions may be indicated by a match bit value of 1.

Figure 8C:
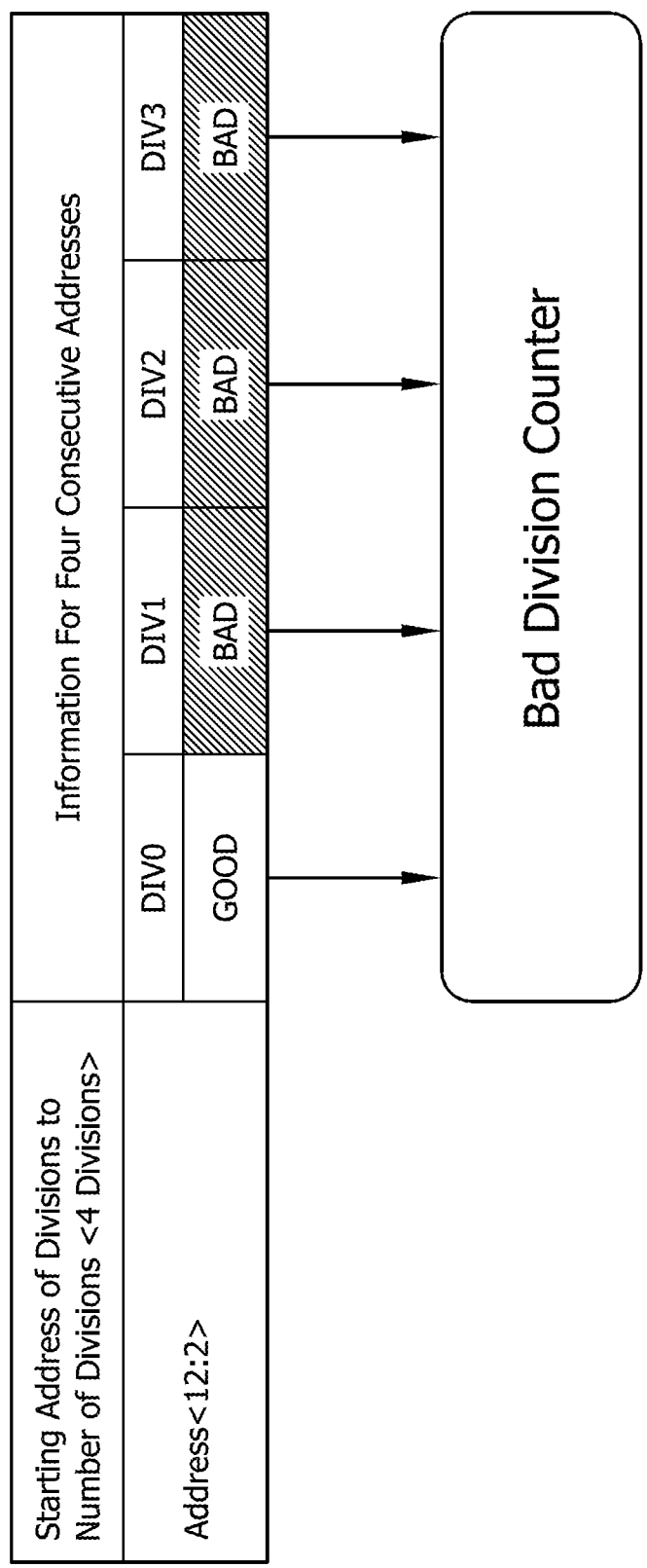
FIG. 8C depicts the match bit information as may be used in a bad division counter.

FIG. 8C depicts the match bit information as may be used in a bad division counter. As shown, the match bits indicating whether the columns in each of the divisions are bad may be input to the division counter, which may determine a total number of bad divisions for the four consecutive logical addresses of the columns. Though not depicted, it may be appreciated that the bad division counter logic may include, for instance, a four-bit adder. The four-bit adder may be configured to take each of the four match bits as inputs to generate, for instance, a two-bit output providing the total number of bad division. Using the new division-based CRD architecture, as shown, it may be possible to generate this information within one clock cycle, while when comparing address information for each individual column, this process may take longer. It may also be appreciated that for match bits indicating a bad division, corresponding pointers for the bad column addresses may be updated such that they fetch a next bad column address or a next set of column addresses for comparison with an incremented CRD_ADD.

FIG. 9A depicts an embodiment of a column redundancy data architecture in which a memory array is divided into five divisions. Specifically, FIG. 9A provides a tabular representation of an array of bad column information organized in accordance with the division-based approach. First (or starting) logical addresses for groupings of four columns are shown in the table. The array of column data may be stored in latches of a CRD plane, and each starting address presented in a separate row of the table may be stored at a separate latch. As shown, the data may include 111 starting addresses, each having a total of 13 bits, though it may be appreciated that in other embodiments, a greater or lesser number of addresses may be stored, and a greater or lesser number of bits may be used for each address.

For the five-division architecture, the first 9 bits may be used to indicate the starting address of the consecutive columns. As described in paragraphs above with respect to FIG. 6, for five divisions, the three lower bits may increment from 0 to 4 in order to select the individual columns. As not all of the columns indicated by the range of addresses may be defective, the table includes a sequence of corresponding match bits for each starting address. The five match bits <4:0> used here may correspond to the five divisions in which the columns are located, and each bit may indicate whether an individual column located within each of the divisions is defective.

FIG. 9B provides a more detailed representation of the match data. As shown, the starting address of the range of columns spanning five divisions (DIV0, DIV1, DIV2, DIV3, and DIV5) is indicated by address<12:3>. The match bits may indicate information for the five consecutive logical addresses corresponding to the columns of each division. For example, each of the five match bits may indicate whether the column located in each division is bad. Where DIV0, DIV3, and DIV4 are good, the first and the third match bits of the five-bit sequence may remain in a low state, 0. Where DIV1 and DIV2 are bad, the corresponding match bits may transition to a high state, 1.

Figure 9C:
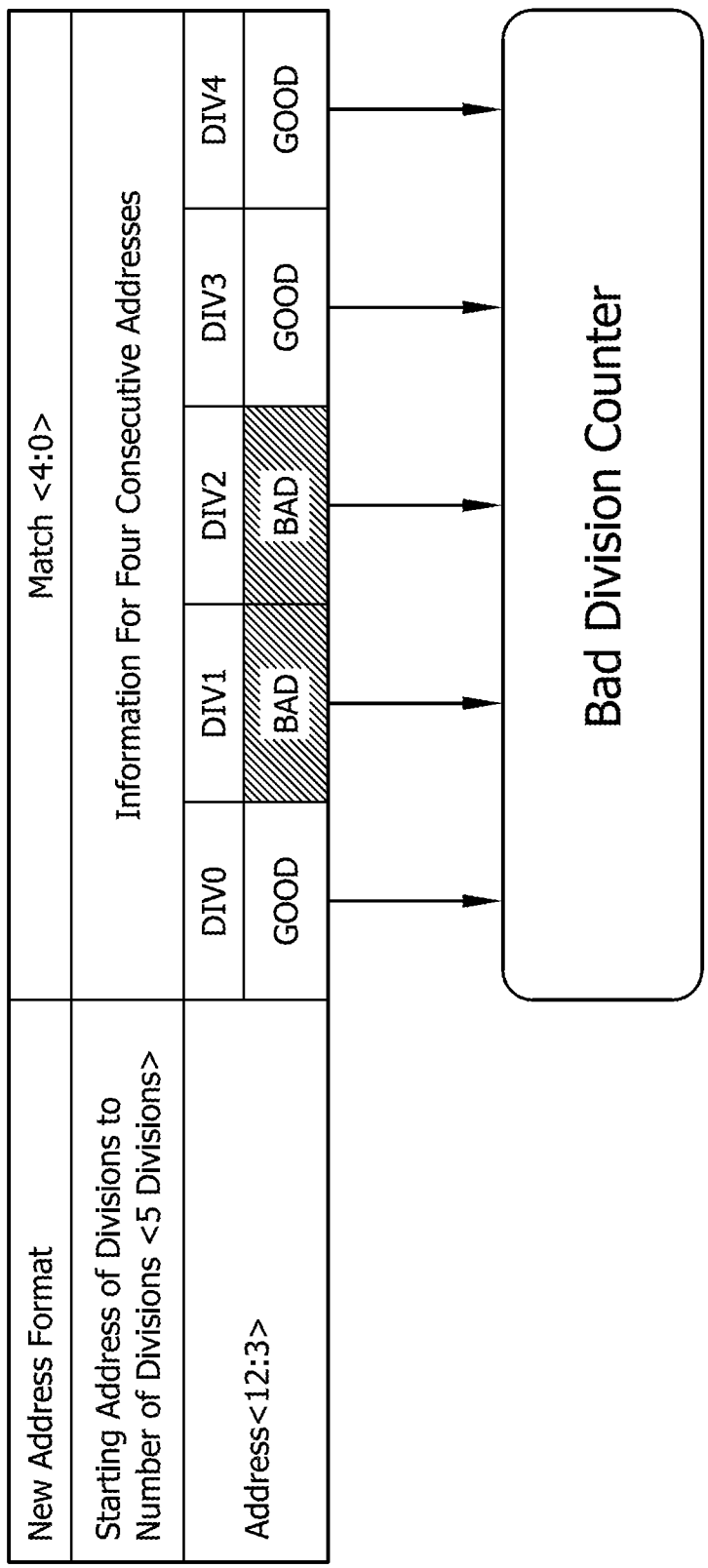
FIG. 9C provides a detailed representation of information indicated by match bits when a division-based architecture is used.

FIG. 9C depicts the match bit information as may be used in a bad division counter. As shown, the match bits indicating whether the columns in each of the divisions are bad may be input to the division counter, which may determine a total number of bad divisions for the five consecutive logical addresses of the columns. Though not depicted, it may be appreciated that the bad division counter logic may include, for instance, a five-bit adder. The five-bit adder may be configured to take each of the five match bits as inputs and generate, for instance a three-bit output providing the total number of bad divisions. Using the new CRD architecture, as shown, it may be possible to generate this information within one clock cycle, while when comparing address information for each individual column, this process may take longer. It may also be appreciated that for match bits indicating a bad division, corresponding pointers for the bad column addresses may be updated such that they fetch a next bad column address or a next set of column addresses for comparison with CRD_ADD.

When implemented in the column redundancy scheme introduced and described above with respect to FIG. 1 and FIG. 2, the division-based CRD architecture described above may allow column redundancy logic to identify defective columns faster than it may when using the individual column-based approach. Because each address stored in the data latches may be used to indicate a range of bad columns rather than only a single bad column, a greater amount of bad column information may be extracted from the latches in any given comparison.

FIG. 10A portrays this operation of the comparator when using the division-based CRD architecture. A "horizontal" comparison or search for bad column information at the range of addresses provides results equal to the number of match bits. As shown, for a four-division scheme, four match bits are returned for a single comparison. In contrast, a comparison performed using an architecture that tabulates column redundancy data on an individual column-basis would provide bad column information for only a single address.

FIG. 10B shows the compounded benefit of the division-based architecture when performing multiple horizontal comparisons at once. In some embodiments, multiple horizontal comparisons may be performed at the same time, such as when multiple comparators operate in a single clock cycle. This may be called a "vertical" or "parallel" search or comparison. Depending on how many parallel searches are performed, the advantages over comparisons using the individual column-based architecture may be multiplied. In examples as shown, assuming that a four-division scheme is implemented, for two comparisons, the search may return the number of bad columns that are present in the next 8 logical addresses. Similarly, if four comparisons are performed at a single time, the number of bad columns that are present in the next 16 addresses may be returned.

Among the advantages of a division-based architecture, scalability may be improved, since the number addresses for which comparisons are performed may be increased to match increases in data input or output speed. Additionally, fewer latches may be necessary for a division-based architecture to store the same amount of column redundancy data as an individual column-based architecture. For instance, only one starting address of a range of column addresses plus a number of corresponding match bits may be needed in the former architecture, whereas an address for each and every bad column is necessary in the latter approach. Finally, fewer addresses need to be compared, since a single comparison between one starting column address and an incoming data address may be performed in place of comparisons with, for example, four or five bad column addresses. This may result in power and space savings by obviating the need for certain combinational logic.

Although features and elements are described above in particular combinations, one of ordinary skill in the art will appreciate that each feature or element can be used alone or in any combination with the other features and elements.

What is claimed is:

1. A circuit comprising:
a column redundancy data array storing an address and a plurality of match bits, wherein a first portion of bits of the address references a range of columns of a memory array and a second portion of bits of the address references a division of the memory array in which a column of the range of columns is located, and wherein each of the match bits indicates whether one of the columns of the range of columns is defective.

2. The circuit of claim 1, wherein a number of the match bits is equal to a number of columns in the range of columns.

3. The circuit of claim 1, further comprising an indexing module configured to generate the first and second portions of bits of the address using a conversion formula.

4. The circuit of claim 1, further comprising a counter circuit configured to determine, based on a value of each match bit, a total number of defective columns in the range of columns.

5. The circuit of claim 4, wherein the counter circuit is further configured to determine, based on the total number of defective columns in the range of columns, an address offset value and to increment an incoming column address based on the address offset value.

6. The circuit of claim 1, further comprising a comparator configured to compare the first portion of bits of the address with a same number of bits of an incoming column address and to determine, based on the comparison and an operation type, whether to perform a read or write operation at the incoming column address.

7. The circuit of claim 6, wherein the address is a first address, and wherein the comparator is further configured to compare a first portion of bits of a second address with an equal number of bits of the incoming column address.

8. A circuit comprising:
means for storing column redundancy data, the column redundancy data comprising an address and a plurality of match bits, wherein a first portion of bits of the address references a range of columns of a memory array and a second portion of bits of the address references divisions of the memory array in which each column of the range of columns are located, and wherein each of the match bits indicates whether one of the columns of the range of columns is defective.

9. The circuit of claim 8, wherein a number of the match bits is equal to a number of columns in the range of columns.

10. The circuit of claim 8, further comprising means for generating the first and second portions of bits of the address using a conversion formula.

11. The circuit of claim 8, further comprising means for determining, based on a value of each match bit, a total number of defective columns in the range of columns.

12. The circuit of claim 11, further comprising means for determining, based on the total number of defective columns in the range of columns, an address offset value; and means for incrementing an incoming column address based on the address offset value.

13. The circuit of claim 8, further comprising means for comparing the first portion of bits of the address with an equal number of bits of an incoming column address; and means for determining, based on the comparison and an operation type, whether to perform a read or write operation at the incoming column address.

14. The circuit of claim 13, wherein the address is a first address, and wherein the means for comparison is further configured to compare a first portion of bits of a second address with an equal number of bits of the incoming column address.

15. A method comprising:
storing column redundancy data, the column redundancy data including an address and a plurality of match bits, wherein the address references a range of columns of a memory array and each of the match bits indicates whether one of the columns of the range of columns is defective;
receiving an incoming column address at which to perform a read or write operation;
determining whether the address matches the incoming column address; and
counting, on a condition the address matches the incoming column address, a number of defective columns based on the plurality of match bits and incrementing the incoming column address based on the number of defective columns.

16. The method of claim 15, wherein the number of defective columns is greater than two.

17. The method of claim 15, wherein the address is a first address and the plurality of match bits is a first plurality of match bits, and wherein the method further comprises:
determining whether a second address matches the incoming column address; and
counting the number of defective columns based on the first plurality of match bits and a second plurality of match bits.

* * * * *